United States Patent
Cao et al.

(10) Patent No.: US 7,427,463 B2
(45) Date of Patent: Sep. 23, 2008

(54) PHOTORESISTS WITH REDUCED OUTGASSING FOR EXTREME ULTRAVIOLET LITHOGRAPHY

(75) Inventors: Heidi Cao, Portland, OR (US); Wang Yueh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 94 days.

(21) Appl. No.: 10/686,031

(22) Filed: Oct. 14, 2003

(65) Prior Publication Data

US 2005/0079438 A1 Apr. 14, 2005

(51) Int. Cl.
G03F 7/00 (2006.01)
G03F 7/004 (2006.01)

(52) U.S. Cl. .................. 430/270.1; 430/311

(58) Field of Classification Search ........... 430/270.1
See application file for complete search history.

(56) References Cited

U.S. PATENT DOCUMENTS

| | | | | |
|---|---|---|---|---|
| 4,156,066 A | * | 5/1979 | Gould | 424/78.06 |
| 4,360,643 A | * | 11/1982 | Naylor | 525/386 |
| 4,603,171 A | * | 7/1986 | Hsieh et al. | 525/105 |
| 4,680,361 A | * | 7/1987 | Koleske et al. | 526/318 |
| 4,835,213 A | * | 5/1989 | Murai et al. | 525/36 |
| 5,071,921 A | * | 12/1991 | Eichenauer et al. | 525/385 |
| 5,739,229 A | * | 4/1998 | Keoshkerian et al. | 526/215 |
| 6,045,973 A | * | 4/2000 | Lundy et al. | 430/281.1 |
| 6,054,252 A | * | 4/2000 | Lundy et al. | 430/285.1 |
| 6,165,678 A | * | 12/2000 | Allen et al. | 430/270.1 |
| 6,166,245 A | * | 12/2000 | Lundy et al. | 560/209 |
| 6,218,073 B1 | * | 4/2001 | Shimizu et al. | 430/273.1 |
| 6,350,330 B1 | * | 2/2002 | Wardle et al. | 149/19.5 |
| 6,384,174 B2 | * | 5/2002 | Hanada et al. | 528/70 |
| 6,406,828 B1 | * | 6/2002 | Szmanda et al. | 430/270.1 |
| 6,472,543 B2 | * | 10/2002 | Kinsho et al. | 549/295 |
| 6,503,685 B1 | * | 1/2003 | Shimizu et al. | 430/270.1 |
| 6,537,727 B2 | * | 3/2003 | Yoon et al. | 430/270.1 |
| 6,599,677 B2 | * | 7/2003 | Szmanda et al. | 430/270.1 |
| 6,680,157 B1 | * | 1/2004 | Fedynyshyn | 430/270.1 |
| 6,686,429 B2 | * | 2/2004 | Dammel et al. | 526/297 |
| 6,692,884 B2 | * | 2/2004 | Fujimori et al. | 430/170 |
| 6,696,217 B2 | * | 2/2004 | Yoon et al. | 430/270.1 |
| 6,737,215 B2 | * | 5/2004 | Dammel et al. | 430/270.1 |
| 6,849,376 B2 | * | 2/2005 | Barclay et al. | 430/270.1 |
| 2003/0168251 A1 | * | 9/2003 | Hawker et al. | 174/258 |
| 2003/0175615 A1 | * | 9/2003 | Miyake et al. | 430/270.1 |
| 2003/0211734 A1 | * | 11/2003 | Maeda et al. | 438/676 |
| 2004/0018442 A1 | * | 1/2004 | Yoon et al. | 430/270.1 |
| 2004/0101780 A1 | * | 5/2004 | Maemoto | 430/273.1 |
| 2005/0008975 A1 | * | 1/2005 | Yoon et al. | 430/281.1 |
| 2005/0032373 A1 | * | 2/2005 | Cameron et al. | 438/689 |

FOREIGN PATENT DOCUMENTS

JP 2002082441 A * 3/2002

OTHER PUBLICATIONS

English language machine translation of JP 2002-082441.*

* cited by examiner

*Primary Examiner*—Amanda C. Walke
(74) *Attorney, Agent, or Firm*—Fish & Richardson P.C.

(57) ABSTRACT

Chemically amplified photoresists with reduced outgassing or no outgassing may be used in a vacuum environment of a lithography tool, such as an extreme ultraviolet lithography tool. A chemically amplified photoresist has a photoacid generator molecule. When the photoacid generator is irradiated, an acid is generated. The acid reacts with a protecting group in the photoresist to form an open-ring structure with reduced outgassing or no outgassing.

30 Claims, 4 Drawing Sheets

PHOTORESISTS WITH REDUCED OUTGASSING FOR EXTREME ULTRAVIOLET LITHOGRAPHY

BACKGROUND

Microchip manufacturers deposit various material layers on a wafer during microchip processing. At certain stages, a photosensitive resist (hereinafter "photoresist") may be deposited on one or more layers. A lithography tool may transmit light to a reticle which has a pattern. Light from the reticle transfers the pattern onto the photoresist and causes a chemical reaction, e.g., solubility change, in the exposed areas of the photoresist. The solubility change is used to selectively remove exposed areas of the photoresist, which leaves a three-dimensional relief image in the photoresist. Portions of the underlying layer which are not protected by the remaining photoresist may undergo further processing, such as etching or ion implantation to form integrated circuit features.

The semiconductor industry has reduced the size of transistor features to increase transistor density and improve transistor performance. The benefits of reducing transistor feature size have driven a reduction in the wavelength of light used in lithography tools in order to define smaller transistor features on a photoresist.

DETAILED DESCRIPTION

The semiconductor industry may continue to reduce transistor size by reducing the wavelength of light in lithography tools to 13.5 nanometers or smaller, i.e., extreme ultraviolet (EUV). An EUV lithography tool may print a pattern on a photoresist with dimensions smaller than dimensions achieved by other lithography tools.

Figure 1:
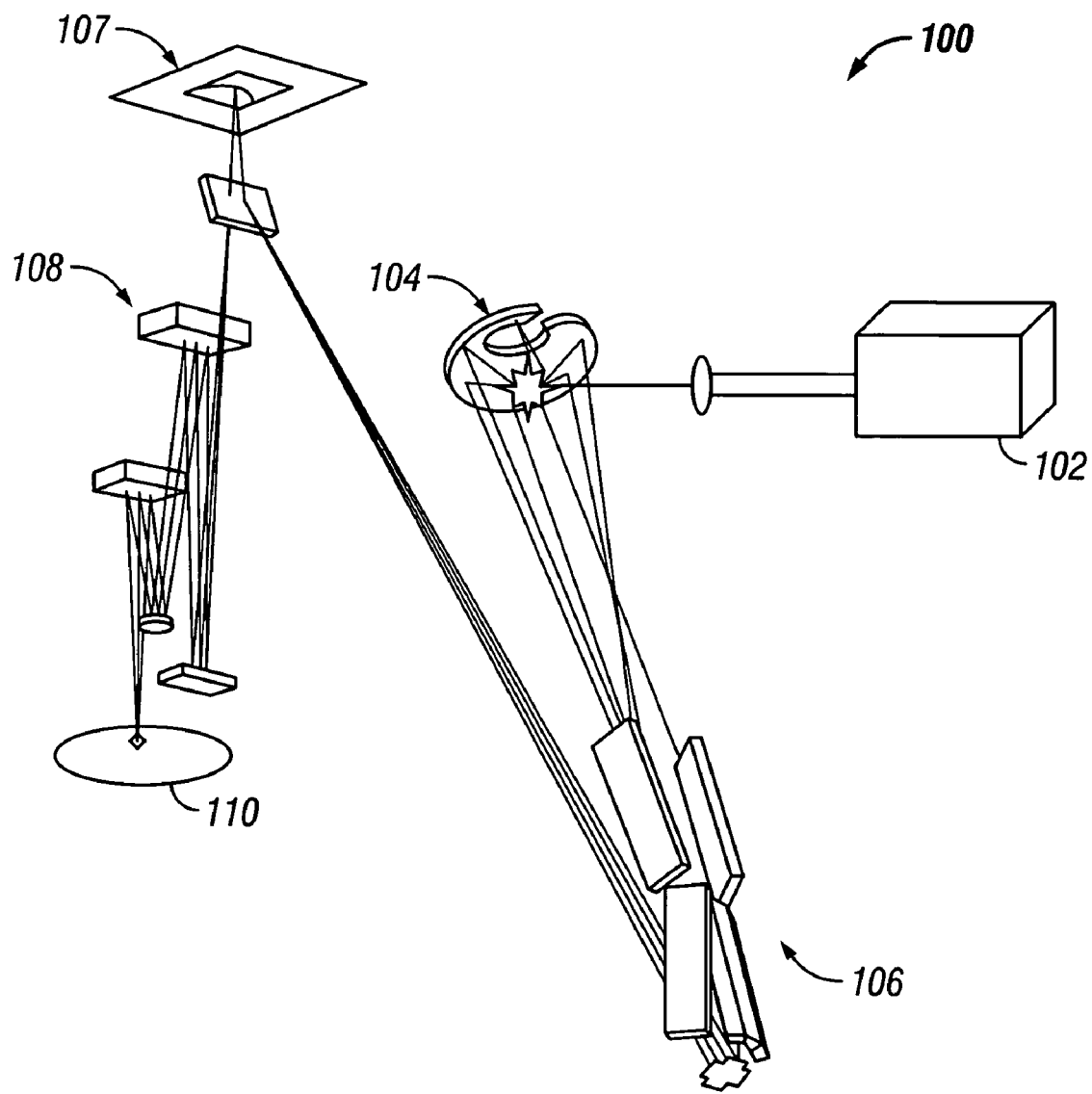
FIG. 1 illustrates an example of an extreme ultraviolet lithography tool.
Figure 2A:
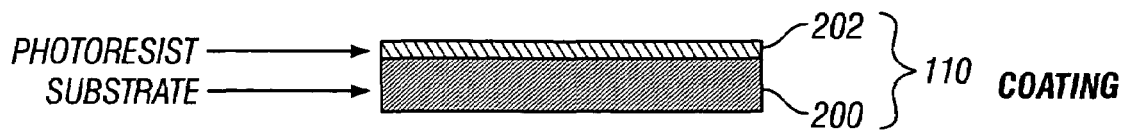
FIGS. 2A-2E illustrate a process of patterning a chemically amplified photoresist using a lithography tool and using the resultant photoresist pattern as a mask for etching an underlying substrate.
Figure 2B:
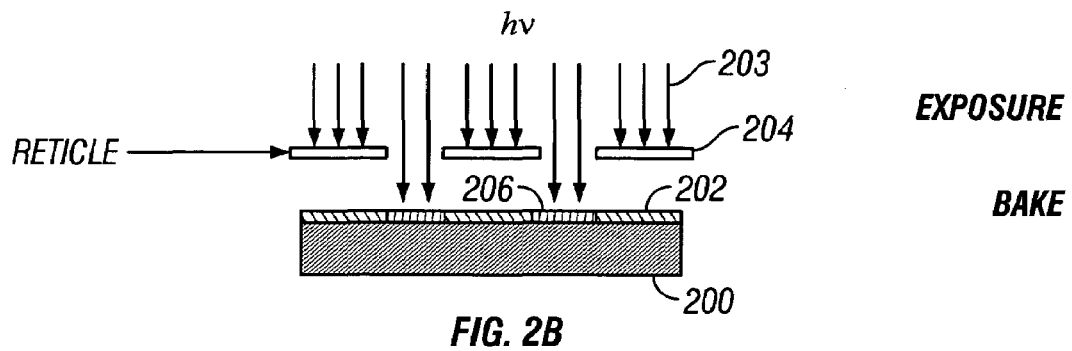
Figure 2C:
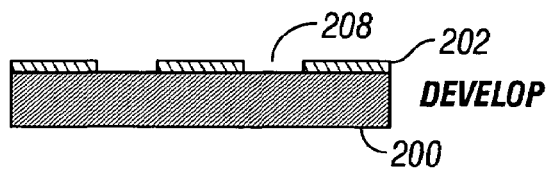
Figure 2D:
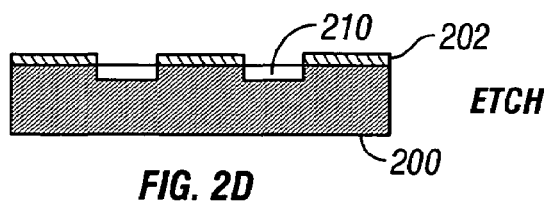
Figure 2E:
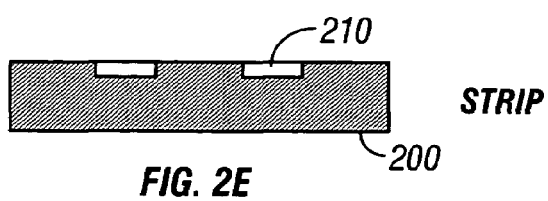

FIG. 1 illustrates an example of an EUV lithography tool 100. The EUV lithography tool 100 includes a laser 102, a laser produced plasma source 104 (or an electric discharge source), condenser optics 106, a reflective reticle 107 with a pattern, and reflective reduction optics 108. The laser 102 may produce radiation which reflects off the reticle 107 to form a patterned image on an object 110, such as a substrate with a photoresist layer. In another embodiment, instead of reflecting light off the reticle 107 as shown in FIG. 1, light may be transmitted through a reticle 204 as shown in FIG. 2B.

FIGS. 2A-2E illustrate a process of patterning a chemically amplified photoresist 202 (described below) using a lithography tool, such as the extreme ultraviolet lithography tool 100 of FIG. 1, and using the resultant photoresist pattern as a mask for etching an underlying substrate 200. The chemically amplified photoresist 202 may be deposited on the substrate 200 by spin coating in FIG. 2A. A lithography tool exposes areas 206 of the chemically amplified photoresist 202 with light 203 (denoted as "hv") which has been patterned by a reticle 204 in FIG. 2B. The light 203 causes a chemical reaction in the exposed areas 206. The light 203 may be extreme ultraviolet (EUV) radiation, for example, with a wavelength of about 13.5 nanometers (nm).

The chemically amplified photoresist 202 and substrate 200 are removed from the lithography tool and baked in a temperature-controlled environment. Radiation exposure and baking change the solubility of the exposed areas 206 to become more soluble than unexposed areas of the photoresist 202. The photoresist 202 may be "developed," i.e., put in a developer solution, which may be an aqueous ($H_2O$) base solution, to remove or dissolve exposed areas 206 of the photoresist 202 in FIG. 2C. If a "positive" photoresist is used, exposed areas 206 may be removed by the solution. If a "negative" photoresist is used, areas which are not exposed to radiation may be removed by the solution. Portions 210 of the substrate 200 which are not protected by the remaining photoresist 202 may be etched in FIG. 2D to form transistor features. The remaining photoresist 202 may be stripped in FIG. 2E.

The present application relates to chemically amplified, reduced out-gassing or non-outgassing photoresists, which may be used in a vacuum environment of a lithography tool, such as an EUV or electron-beam lithography tool. A chemically amplified photoresist has a photoacid generator (PAG). When the PAG is irradiated, an acid catalyst is generated by a photochemical reaction.

Figure 3A:
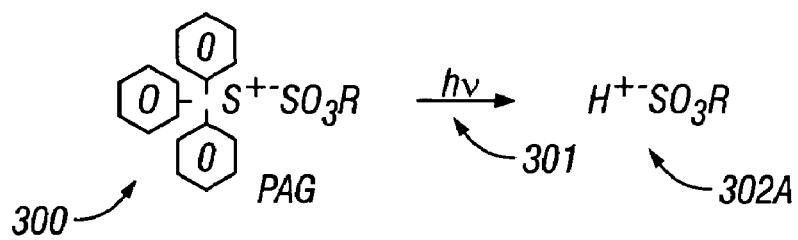
FIGS. 3A and 3B illustrate two components of an example of a conventional 248-nanometer lithography chemically amplified photoresist.
Figure 3B:
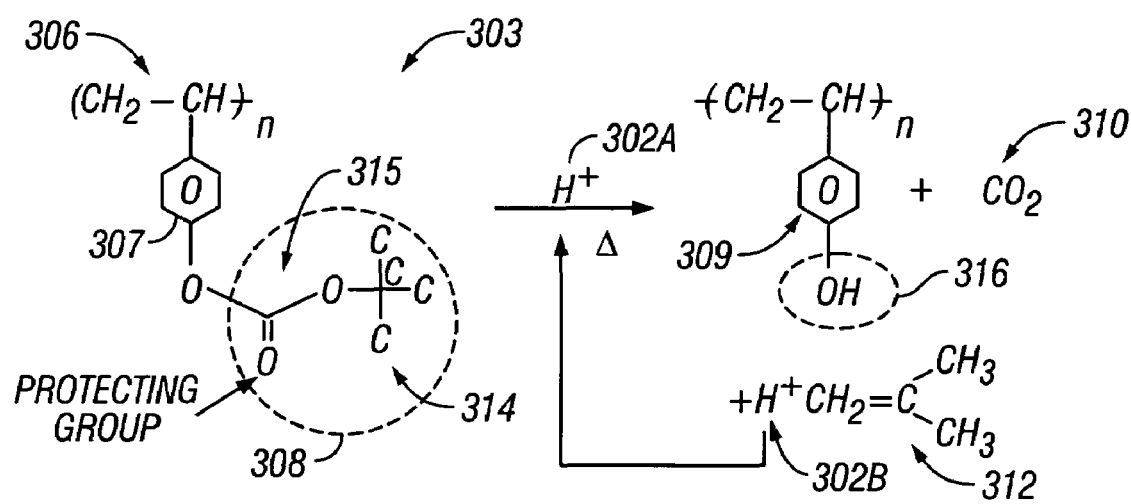

FIGS. 3A and 3B illustrate an example of two components 300, 303 which may be in a conventional 248-nm lithography chemically amplified photoresist. FIG. 3A illustrates an example of a photoacid generator (PAG) molecule 300, which is sensitive to exposed light 301 (denoted as "hv") and will produce an acid 302A. The acid 302A acts as a catalyst to cause a deprotection reaction, as described below.

FIG. 3B illustrates an example of a polymeric component 303 of a chemically amplified photoresist. The polymeric component 303 contains a polymer backbone 306 and side chains composed of a phenyl group 307 (e.g., styrene) and a protecting group 308. The protecting group 308 reacts with the generated acid 302A of FIG. 3A and produces a hydroxy styrene (solid) 309, gases 310, 312 (described below) and more acid (H+) 302B. As the acid 302A of FIG. 3A diffuses through the photoresist, more acid 302B is regenerated after each deprotection reaction of FIG. 3B. Thus, the production of a single acid 302A results in the catalysis of many deprotection reactions. The acid 302A, 302B may be used repeatedly to promote the reaction in FIG. 3B.

Acid generation will occur during radiation exposure (FIG. 3A), and some deprotection reaction (removing the protecting group 308 in FIG. 3B) may occur during radiation exposure, even though acid diffusion is limited at room temperature. Most of the deprotection reaction will occur during the bake step, when the acid 302A, 302B is able to diffuse more freely at higher temperatures. The deprotection reaction that occurs as the acid 302A, 302B diffuses through the photoresist will make the exposed areas 206 of the photoresist (FIG. 2B) more soluble in an aqueous base solvent compared to unexposed regions of the photoresist 202. A "chemically amplified" photoresist requires less radiation to remove exposed areas 206 of the photoresist compared to a non-chemically amplified photoresist.

Figure 4:
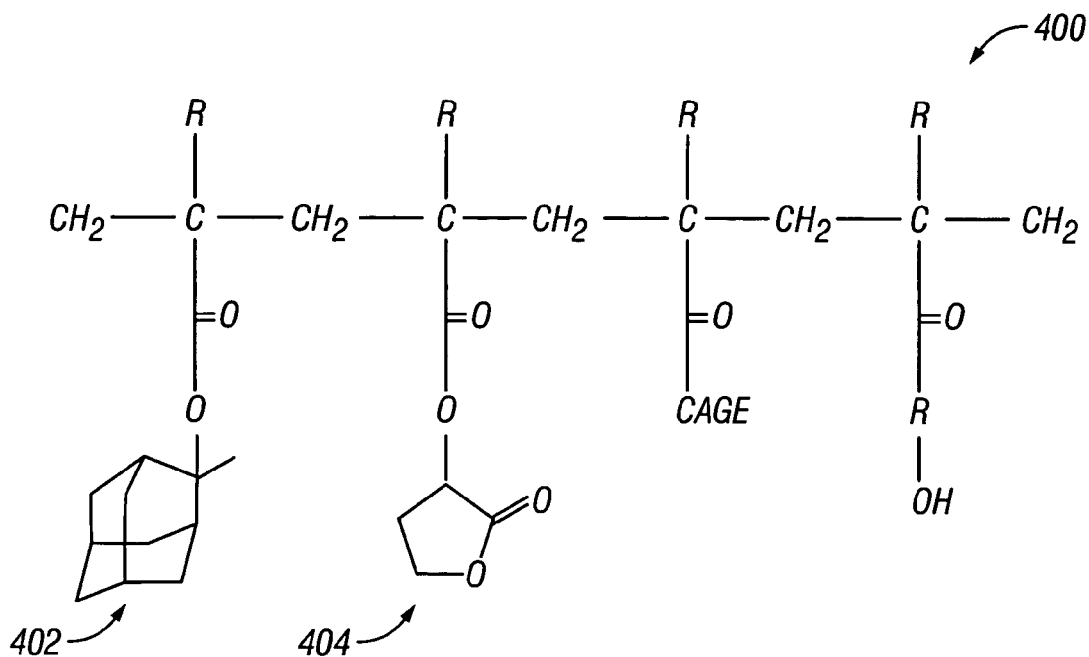
FIG. 4 illustrates an example of a chemically amplified photoresist with a bulky deprotecting group.

Those of ordinary skill in photoresist chemistry know that a "protecting group" (also called a "blocking group"), such as the protecting group 308 in FIG. 3B, is a reactive functional group which may be converted into a different functional group, wherein the properties of the molecule (i.e., polymer solubility) are changed. Protecting groups of chemically amplified photoresists may include t-Butyl 314 (FIG. 3B) and/or methyl adamantyl 402 (FIG. 4). A protecting group is typically "cleaved" (i.e., chemical bonds are broken)(also called "de-blocking") from the photoresist side chain during radiation exposure and baking.

For example, the generated acid 302A in FIG. 3A will cleave the ester linkage 315 in FIG. 3B to remove the protecting group 308. This action will create a hydroxyl (OH)-terminated molecule 316, more acid H+ 302B, $CO_2$ 310, and isobutene 312. Since $CO_2$ 310 and isobutene 312 formed by deprotection of polyhydroxystyrene (FIG. 3B) are gaseous, they will outgas from the photoresist. "Outgassing" refers to when a molecule moves from a solid state to the surrounding gaseous environment.

If the molecules generated during radiation exposure are bulky (solid), they would not outgas under normal atmospheric conditions that exist in most exposure tools, such as a 248-nm lithography tool and a 193-nm lithography tool. However, even bulky molecules may outgas if they are put in a vacuum environment or at high temperatures. Since EUV lithography is performed in a vacuum environment, bulky protecting groups that are typically used to reduce outgassing for 248-nm lithography and 193-nm lithography will outgas in the EUV vacuum environment.

FIG. 4 illustrates an example of a chemically amplified photoresist 400 with a bulky protecting group 402. The photoresist 400 is an acrylate material designed for use in 193-nanometer lithography. The photoresist 400 has a "bulky" methyl adamantyl ester protecting group 402. The ester linkage on the bulky protecting group 402 will be cleaved during radiation exposure and baking. The resulting methyl adamantane does not outgas in air (non-vacuum) due to its large mass, but may outgas in a vacuum environment.

Outgassed molecules may contaminate and damage optics in an EUV lithography tool, such as the EUV lithography tool 100 of FIG. 1. Contamination may reduce the reflectivity of the optics, and therefore reduce throughput. Since throughput may already be a challenge for EUV lithography, contamination of the optics may be a significant concern. Cleaning strategies for EUV optics are being investigated, but it is known that some contaminants may cause irreversible damage. Contaminants which may be cleaned would mean considerable down time for EUV tools, and likely some loss in reflectivity of the optics even after cleaning. A strategy for mitigating or preventing optics contamination is to design photoresists that reduce or avoid outgassing.

Figure 5A:
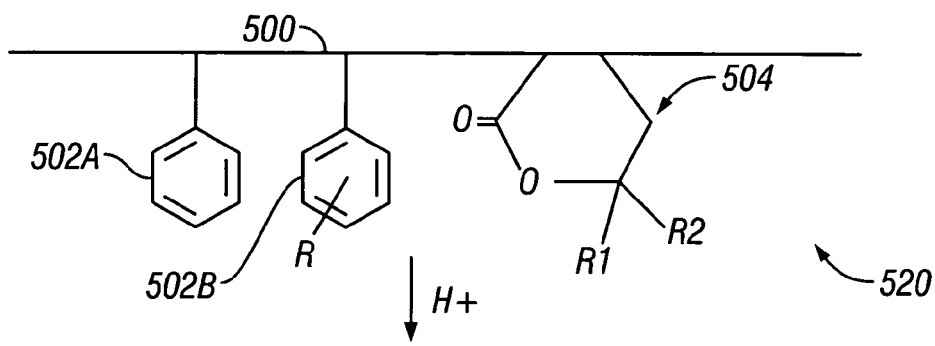
FIG. 5A shows an example of a chemically amplified photoresist composed of a polymer backbone and side chains, which include a non-cleaving deprotecting group.

FIG. 5A shows an example of a chemically amplified photoresist 520 that is designed to have reduced or zero outgassing from a deprotection reaction. The chemically amplified photoresist 520 in FIG. 5A has a polymer backbone 500 and side chain groups 502A, 502B, and 504 which are bonded to the polymer backbone 500. Side groups 502A, 502B may include styrene rings (carbon and hydrogen) with or without functional groups R attached. Functional group R may be hydroxide (OH), an alkyl group (e.g., methyl ($CH_3$) or ethyl ($CH_2CH_3$)), a cage group (e.g., methyl adamantyl 402 in FIG. 4) or other selected groups.

The side chain group 504 in FIG. 5A is a reduced outgassing or non-outgassing protecting group where no new molecules are generated after a deprotection reaction (described below). The non-outgassing protecting group 504 may be a lactone, which may have groups R1 and R2 attached. A lactone is a cyclic ester. The number of carbons in the lactone may vary. An example of a lactone with a 5-sided ring 404 is shown in FIG. 4, and an example of a lactone with a 6-sided ring 504 is shown in FIG. 5A. The non-outgassing protecting group 504 of FIG. 5A comprising lactone is incorporated into the polymer backbone 500.

R1 and R2 in FIG. 5A may be electron-withdrawing groups. R1 may be the same as R2 or different than R2. R1 and R2 may each be an alkyl group, a cage group, a phenyl group or other selected group. For example, R1 and R2 may each be COH, $NO_2$, OH or $CF_3$.

The non-outgassing protecting group 504 contained in the chemically amplified photoresist 520 will react with an acid catalyst to change the photoresist's solubility in an aqueous base developer with reduced outgassing or zero outgassing from the deprotection reaction, as explained below.

Figure 5B:
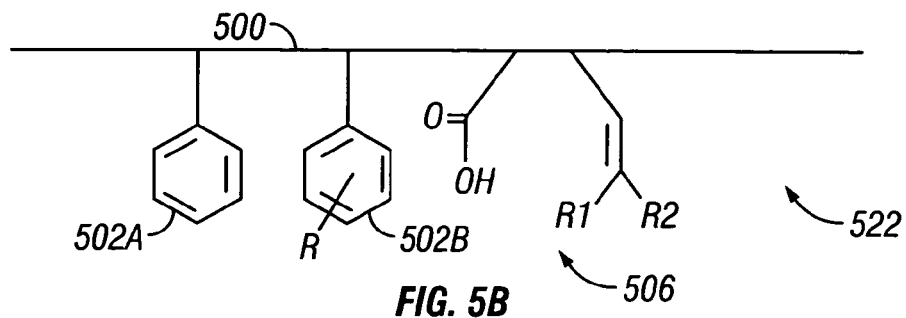
FIG. 5B shows the chemically amplified photoresist of FIG. 5A after radiation and baking.

FIG. 5B shows the chemically amplified photoresist 520 of FIG. 5A after a deprotection reaction. In the presence of a strong acid (H+) generated from radiation (PAG chemistry described above with reference to FIG. 3A), the non-outgassing protecting group 504 in FIG. 5A will undergo a ring-opening deprotection reaction (also called "ring-opening mechanism," "ring-opening chemistry" or "ring opening hydrolysis"). For example, a lactone may be ring-opened by hydrolysis, especially with assistance from electron-withdrawing groups, such as R1 and R2 in FIG. 5A. The ring-opening deprotection reaction produces an open ring structure 506 bound to the polymer backbone 500 in FIG. 5B. The ring-opening deprotection reaction may occur during radiation exposure in a vacuum and/or during baking.

A bond within the non-outgassing protecting group 504 in FIG. 5A may be broken to form the structure in FIG. 5B, but no new (outgassed) molecules may be generated in FIG. 5B after radiation and baking. Thus, a main source of outgassing (from "cleaved" deprotecting groups as in FIG. 3B) may be reduced or avoided when the chemically amplified photoresist 520 in FIG. 5A is exposed to EUV radiation in a vacuum. The deprotection reaction may occur without generating new molecules that could potentially outgas and contaminate optics in a lithography tool.

The open ring structure 506 will increase the solubility of the radiated and baked photoresist 522 in an aqueous base developer.

The chemically amplified photoresist 520 in FIG. 5A may be optimized to improve other functions, such as etch resistance, adhesion, sensitivity, or other photoresist properties. These properties may be engineered by varying the number of each group 502A, 502B, distribution of each group 502A, 502B, and/or by varying the functionality of group R. For example, adhesion may be improved by attaching a hydroxyl functional group to one or more of the styrene side chain groups.

The chemically amplified photoresist 520 may also be optimized by selecting groups R1 and/or R2 for optimum performance. For example, the sensitivity of the resist could be increased by using high electron-withdrawing groups such as $CF_3$ for the R1 and/or R2 groups, since the placement of electron-withdrawing groups next to an ester linkage may reduce the activation energy for the ring-opening mechanism.

An alternative method to design photoresists with cyclic protecting groups is to copolymerize the cyclic protecting groups with monomers other than hydroxystyrene, to optimize for other photoresist parameters, such as etch resistance, adhesion, etc.

A number of embodiments have been described. Nevertheless, it will be understood that various modifications may be made without departing from the spirit and scope of the application. Accordingly, other embodiments are within the scope of the following claims.

What is claimed is:

1. A photoresist comprising:
   a polymer backbone;
   a lactone bonded to the polymer backbone and having a tertiary carbon bonded to the lactone carbonyl oxygen, the lactone being reactable under semiconductor processing conditions and in the presence of an acid to undergo a ring-opening reaction and form an open ring structure to switch a solubility of the photoresist in a developer without generating an organic species that can outgas in a vacuum environment;
   a first group comprising nitrogen dioxide and attached to the carbon bonded to the lactone carbonyl oxygen; and
   a side chain bonded to the polymer backbone, the side chain comprising a styrene ring.

2. The photoresist of claim 1, wherein the lactone comprises a five-sided ring of carbon and oxygen.

3. The photoresist of claim 1, wherein the lactone comprises a six-sided ring of carbon and oxygen.

4. The photoresist of claim 1, wherein the first group comprises an electron-withdrawing group.

5. The photoresist of claim 1, wherein the second group comprises an alkyl group.

6. The photoresist of claim 1, wherein the second group comprises a cage group.

7. The photoresist of claim 1, wherein the second group comprises a phenyl group.

8. The photoresist of claim 1, wherein the second group comprises carbon, oxygen and hydrogen.

9. The photoresist of claim 1, wherein the second group comprises hydroxide.

10. The photoresist of claim 1, wherein the second group comprises —$CF_3$.

11. The photoresist of claim 1, further comprising a second group attached to the carbon bonded to the lactone carbonyl oxygen, the first and second groups comprising the same molecules.

12. The photoresist of claim 1, further comprising a second group attached to the carbon bonded to the lactone carbonyl oxygen, the first and second groups comprising different molecules.

13. The photoresist of claim 1, further comprising a photoacid generator molecule to form the acid upon radiation exposure.

14. The photoresist of claim 1, wherein the lactone is reactable in the presence of the acid to change a solubility of the photoresist in a basic aqueous developer.

15. The photoresist of claim 1, wherein the lactone is reactable in the presence of the acid to form an open ring structure bound to the polymer backbone with no outgassing molecules in a vacuum environment.

16. The photoresist of claim 15, wherein the open ring structure increases solubility of the photoresist in an aqueous base developer.

17. The photoresist of claim 1, further comprising a side chain styrene group bonded to the polymer backbone.

18. The photoresist of claim 17, wherein the side chain styrene group is attached to a group comprising at least one of hydroxide (OH), an alkyl group and a cage group.

19. A method comprising:
   forming a photoresist having a polymer backbone, a lactone bonded to the polymer backbone, and a side group bonded to the polymer backbone, wherein the side group includes a styrene ring; and
   switching the solubility of the photoresist in a developer by exposing the lactone under vacuum, wherein the switching of the solubility causes the lactone to undergo a ring opening reaction upon exposure to an acid catalyst without molecules outgassing from the photoresist, and
   wherein the lactone includes
      a tertiary carbon bonded to the lactone carbonyl oxygen, and
      a first group comprising —$CF_3$ and attached to the tertiary carbon bonded to the lactone carbonyl oxygen.

20. The method of claim 19, wherein forming the photoresist comprises forming a chemically amplified photoresist.

21. The method of claim 19, wherein forming the photoresist comprises forming the photoresist with a second group attached to the carbon bonded to the lactone carbonyl oxygen, the second group comprising one or more of an alkyl group, a cage group, and a phenyl group.

22. The method of claim 19, wherein forming the photoresist comprises forming the photoresist with a second group attached to the carbon bonded to the lactone carbonyl oxygen, the first and second groups being identical.

23. A method comprising:
   radiating an area of a chemically amplified photoresist in a vacuum environment to generate an acid within the photoresist and catalyze a ring-opening reaction of a lactone that includes a tertiary carbon bonded to the lactone carbonyl oxygen, wherein the chemically amplified photoresist includes
      a side group bonded to the polymer backbone and the side group includes a styrene ring, and
      a first group comprising nitrogen dioxide and attached to the carbon bonded to the lactone carbonyl oxygen; and
   catalyzing a ring-opening reaction in the photoresist, the ring-opening reaction sufficing to switch the solubility of the photoresist in a developer without the generation of molecules that outgas from the photoresist in the vacuum environment.

24. The method of claim 23, wherein said radiating comprises radiating with extreme ultraviolet (EUV) radiation.

25. The method of claim 23, wherein said radiating comprises radiating the area of the photoresist comprising a hydroxystyrene copolymer.

26. The method of claim 19, wherein forming the photoresist comprises forming the polymer backbone using a hydroxystyrene copolymer.

27. The method of claim 19, wherein forming the photoresist comprises forming the lactone to undergo the ring opening reaction upon exposure to the acid catalyst and under semiconductor processing conditions.

28. A photoresist comprising:
   a polymer backbone;
   a lactone fused to the polymer backbone, the lactone comprising a tertiary carbon bonded to the lactone carbonyl oxygen;
   a first group comprising —$CF_3$ and attached to the carbon bonded to the lactone carbonyl oxygen; and
   a styrene ring side chain bonded to the polymer backbone,
   wherein sufficient lactone is fused to the polymer backbone so that a ring-opening reaction of the lactone to form an open ring structure suffices to switch a solubility of the photoresist in a developer.

29. A photoresist comprising:
   a lactone bonded to a polymer backbone, the lactone being reactable under semiconductor processing conditions and in the presence of an acid to undergo a ring-opening reaction and form an open ring structure without generating an organic species that can outgas in a vacuum environment, the lactone having a first group comprising nitrogen dioxide attached to the carbon bonded to the lactone carbonyl oxygen.

30. A photoresist comprising:

a lactone bonded to a polymer backbone, the lactone being reactable under semiconductor processing conditions and in the presence of an acid to undergo a ring-opening reaction and form an open ring structure without generating an organic species that can outgas in a vacuum environment, the lactone having a first group comprising —$CF_3$ attached to the carbon bonded to the lactone carbonyl oxygen.

* * * * *